(12) United States Patent
Lowack et al.

(10) Patent No.: US 7,476,412 B2
(45) Date of Patent: Jan. 13, 2009

(54) METHOD FOR THE METALIZATION OF AN INSULATOR AND/OR A DIELECTRIC

(75) Inventors: Klaus Lowack, Erlangen (DE); Günter Schmid, Hemhofen (DE); Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 139 days.

(21) Appl. No.: 09/817,963

(22) Filed: Mar. 27, 2001

(65) Prior Publication Data

US 2002/0142092 A1 Oct. 3, 2002

(30) Foreign Application Priority Data

Mar. 27, 2000 (DE) .................. 100 15 214

(51) Int. Cl.
| B05D 5/12 | (2006.01) |
| G03F 7/00 | (2006.01) |
| H01L 21/00 | (2006.01) |

(52) U.S. Cl. ............. 427/96.1; 427/98.1; 427/304; 427/437; 427/443.1; 427/532; 430/311; 430/315

(58) Field of Classification Search ............. 427/96, 427/98, 304, 305, 306, 437, 443.1, 532; 430/311–319
See application file for complete search history.

(56) References Cited

U.S. PATENT DOCUMENTS

| 4,448,804 A * | 5/1984 | Amelio et al. ............ 427/98 |
| 4,596,759 A * | 6/1986 | Schupp et al. ........... 430/271.1 |
| 4,666,739 A | 5/1987 | Roubal |
| 4,948,707 A * | 8/1990 | Johnson et al. ............ 430/311 |
| 5,021,129 A * | 6/1991 | Arbach et al. ............ 204/15 |
| 5,081,005 A * | 1/1992 | Chakravorty et al. ....... 430/325 |
| 5,387,493 A * | 2/1995 | Imabayashi et al. ...... 430/280.1 |
| 5,468,597 A * | 11/1995 | Calabrese et al. .......... 430/315 |
| 5,648,125 A * | 7/1997 | Cane ..................... 427/534 |
| 5,679,498 A * | 10/1997 | Greenwood et al. ........ 430/312 |
| 5,800,858 A * | 9/1998 | Bickford et al. ........... 427/97 |
| 5,998,237 A * | 12/1999 | Conrod et al. ............ 438/106 |
| 6,136,513 A * | 10/2000 | Angelopoulos et al. ..... 430/315 |
| 6,207,351 B1 * | 3/2001 | Cywar et al. .............. 430/311 |
| 6,212,769 B1 * | 4/2001 | Boyko et al. .............. 29/852 |
| 6,362,484 B1 * | 3/2002 | Beyne et al. ............. 250/374 |
| 2003/0207095 A1 | 11/2003 | Lowack et al. |

FOREIGN PATENT DOCUMENTS

| DE | 198 51 101 A1 | 5/1999 |
| DE | 198 13 180 A1 | 10/1999 |
| EP | 0 498 258 A1 | 8/1992 |
| EP | 1 138 804 A2 | 10/2001 |
| WO | 99/49544 | 9/1999 |

* cited by examiner

*Primary Examiner*—Brian K Talbot
(74) *Attorney, Agent, or Firm*—Laurence A. Greenberg; Werner H. Stemer; Ralph E. Locher

(57) ABSTRACT

The invention relates to a process for the metallization of an insulator and/or a dielectric, wherein the insulator is firstly activated, it is subsequently coated with another insulator and the latter is patterned, then the first is seeded and lastly metallized.

5 Claims, 1 Drawing Sheet

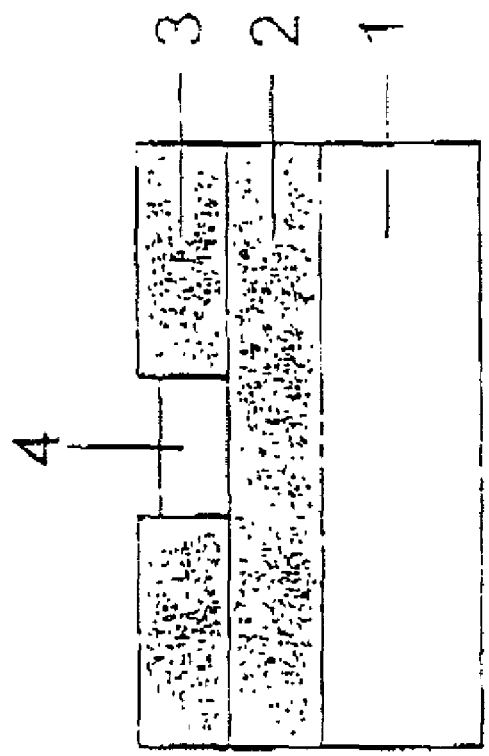
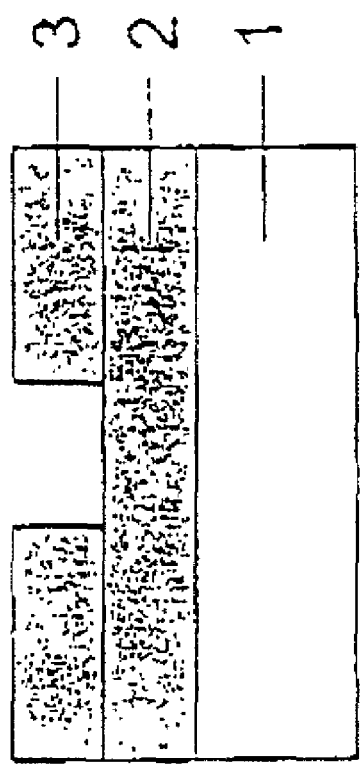

METHOD FOR THE METALIZATION OF AN INSULATOR AND/OR A DIELECTRIC

BACKGROUND OF THE INVENTION

Field of the Invention

The invention relates to a process for the metallization of an insulator and/or a dielectric.

The metal layer on an insulator, for example the insulating layer of an electronic or microelectronic component, is currently applied in such a way that a thin metal layer is firstly applied to the insulator by means of a vacuum process. After covering with photoresist and structuring the latter, the metal layer is chemically or electrochemically thickened, the resist is subsequently stripped and the first thin metal layer is etched back. This process is complex and expensive. Furthermore, the stripping of the resist can lead to particle formation and consequently to a yield reduction.

DE 198 51 101 A1 discloses a process for the selective deposition of a metal layer on the surface of a plastic substrate. In this case, the regions of the surface which are to be coated are exposed to electromagnetic radiation, which cleaves chemical bonds and provides functional groups as reactive centres. The irradiation is carried out, in particular, with UV radiation at a wavelength <320 nm, preferably 222 nm. After the irradiation, which is carried out with the aid of a mask or by means of a scribing laser beam, a noble metal compound is bound to the reactive functional groups of the surface. To that end, the plastic part, either while still immersed in a swelling solution, for example a 5-molar aqueous NaOH solution, or directly, is brought into contact with a solution containing the substance to be deposited, i.e. with a seed solution. The metal layer is subsequently deposited in an electroless metallization bath.

Such an approach cannot be employed in microelectronics since energetic radiation, in particular of the wavelength 222 nm, is required for cleaving the chemical bonds. Moreover, sufficiently powerful lamps of this wavelength do not exist, so that the exposure times are significantly higher (factor >10) than in the case of standard illumination. For this reason, however, the throughput of seedable substrates becomes very limited, and the necessary excimer UV lamps are also extremely expensive. Furthermore, low-molecular fragments, which can contaminate the expensive masks, are released during the cleavage of the bonds. Another disadvantage of the known process is that it only works positively, i.e. only the exposed regions can be seeded. A procedure using the negative mode, in which the unexposed regions are seeded, however, is not possible. This can hence entail high additional costs for new masks when, for example, only negative masks are available for already existing processes.

For the metallization of dielectric layers on an electronic component, DE 199 57 130.9 (still unpublished) discloses a process in which a photosensitive dielectric is applied to a substrate, the dielectric is exposed in a subsequent working step and, with or without heat treatment, is seeded and metallized. The disadvantage with this method is that it is restricted to photosensitive dielectrics.

SUMMARY OF THE INVENTION

It is an object of the invention to provide a process for the metallization of insulators which is compatible with the conditions of existing process lines, which works in the positive and negative modes, and which is not restricted to photosensitive dielectrics.

The object and subject of the invention are achieved by a process for the metallization of at least one insulating layer of an electronic or microelectronic component, whose layer thickness is at most 50 µm, wherein firstly at least one insulating layer is applied to the substrate and is activated by treatment with an activator, then another insulating layer is applied and patterned, and lastly the first insulation layer is seeded and metallized.

The process according to the invention can be applied to all insulating layers of an electronic or microelectronic component, provided that they can be activated by suitable activators in such a way that seeding is possible.

According to one embodiment, 5 layers are applied to a substrate and respectively patterned. This structure is then activated before the top layer is applied and patterned. Subsequently, the bare surface of the activated lower layers is seeded and metallized.

Using the present process, e.g. neighbouring insulating layers can be selectively metallized, e.g. by firstly activating the lower layer and then applying the upper layer. Before the metallization, the upper layer is patterned so that the lower layer is bare at the positions where metallization is to be carried out. During the seeding and metallization, only the lower and activated layer is then metallized.

The term "insulating layer or insulation layer" is here intended to mean an electrically insulating material which remains in the component after this component has been fabricated, i.e. is not removed. This is not intended to include materials which are used as patterning auxiliaries and are removed after a process (e.g. metallization, etching) has been carried out, for instance commercial photoresists based on novolak. Likewise, materials which are a constituent of the substrate (e.g. printed circuit boards based on epoxy resin) or are used as a covering (e.g. a passivation layer on a silicon oxide and/or nitride IC or an IC package of filled epoxy resin, i.e. a mould compound) are not "insulating layers" in the sense of the term used here.

The thickness of the insulating layer is preferably between 0.05 and 50 µm, particularly preferably between 0.1 and 20 µm.

The insulating layer preferably consists of a polymer. The polymer advantageously has high chemical and thermal stability. This allows it to withstand soldering and cleaning processes as well as the activation (chemical and/or physical) without being damaged. In particular, the use of the following types of polymers has proved to be advantageous: dielectrics such as polyimides, polybenzoxazoles, polybenzimidoxazoles; predominantly aromatic polyethers, polyether ketones, polyether sulphones; benzocyclobutene, aromatic hydrocarbons, polyquinolines, polyquinoxalines, polysiloxanes (silicones), polyurethanes or epoxy resins. Copolymers or mixtures of these polymers with one another are likewise suitable. Also suitable are compounds or polymers with organic-inorganic structure, such as e.g. organosilicon, organophosphorus or organoboron compounds. As is known, all the said material classes may either be applied in their final form (spin coating, screen printing etc.) or, alternatively, they are vapour-deposited on the substrate, or on the first insulation layer, in a preliminary stage and the polymer is produced there. Examples of layers which can be produced on the substrate, or on an insulating layer, include layers of carbon, a-C:H as well as a-C:H layers (amorphous) with further elements such as Si, P, O or B. Purely inorganic materials such as silicon oxide and nitride are only included in this category if they—as the upper of the two layers, are applied and patterned e.g. via a shadow mask, printing technique and/or lithography.

In principle, all materials are suitable which are stable during the processes to be carried out, exhibit good electrical insulation and do not have a perturbing effect on the finished component. Photosensitive formulations of the insulating materials are especially suitable.

The insulating layer may also contain several of the aforesaid constituents and a filler. Especially for use as a paste, but also for screen printing, a suitable filler may be added to the insulating material and/or dielectric. It may, for example, be applied to the substrate in dissolved form or as a paste. Examples of suitable techniques include spin coating, casting, dispensing, scraping, tampon printing, inkjet printing and/or screen printing.

A first insulating layer is applied to the substrate or another insulating layer, for example by the spin coating technique, and is dried and/or baked if appropriate, when this is necessary in order to obtain the final properties. It is then activated with an activator. A second insulation layer is subsequently applied to the first, and is dried. The second (upper) insulating layer is, for example for patterning, exposed through a mask, developed and dried and/or baked.

Before the activation, the first insulating layer may optionally be patterned as well.

The activation may then be carried out by immersion, etching, exposure, irradiation, sputtering, heating, partial dissolving, wetting or another known technique.

Depending on the embodiment, the activator is a gas (or a gas mixture), a liquid, a solution or a plasma. The activator may, in particular, also be a combination of a gas with a liquid or a different combination of several activators. The activation selectively modifies an insulating layer or the surface of an insulating layer, for example so that subsequently only this layer can be seeded and/or metallized. A further activation, such as one suitable for subsequent photosensitization, and other types of activation, are also covered by the invention.

Liquid activators are e.g. basic reagents such as solutions of one or more alkali metal and/or alkaline earth metal hydroxides, ammonium hydroxides; oxidizing reagents such as hydrogen peroxide, chromate, permanganate, (per)chlorate and/or peroxosulphate solution; solutions which contain an acid such as sulphuric, hydrochloric, nitric and/or phosphoric acid. All the said solutions may be used individually or in any desired combination.

Examples of activators which are in plasma form include: oxygen, chlorine, carbon dioxide, sulphur dioxide, noble gas and/or ammonia plasmas; examples of suitable gases include ozone, oxygen, halogens and/or sulphur dioxide, and mixtures thereof.

The substrate is preferably a semiconductor (silicon (Si), gallium arsenide, germanium (Ge)) or ceramic, and it may already have electronic circuits including metal and insulating layers below the first insulating layer (e.g. a front-end processed substrate). The substrate may, however, also be glass, a printed circuit board and/or a metal. The substrate may furthermore be one of the aforesaid materials with an applied insulating layer.

The seed solution is a solution or emulsion of a metal (or of a metal compound) in ionogenic or colloidal form. This solution may be neutral, basic or acidic. Preferred seed solutions are all solutions of metals and non-metals, or compounds thereof, which catalyse the deposition of a metal from a redox-chemically metastable solution of this metal. For the preparation of the seed solution, it is preferable to use noble metals (ruthenium (Ru), rhodium (Rh), palladium (Pd), osmium (Os), iridium (Ir), platinum (Pt), silver (Ag), gold (Au)), or compounds and complexes thereof (organic and/or inorganic). Palladium compounds such as palladium acetate and palladium chloride are already used for metallization.

As complexes, both the classical cis-diamino-di(pseudo) halo or alkenyl complexes of Pt(II) or Pd(II) are suitable, since they contain suitable groups for the reaction. Trisphosphino complexes of Pd and Pt already contain the metal in oxidation state 0, so that the formation of seeds or clusters is considerably simplified and is promoted on modified surfaces. The ligand systems may be very slightly modified (sulphonation, amination, e.g. 3-[bis(3-sulphophenyl)-phosphino]benzenesulphonic acid; 1,3,5-triaza-7-phosphatricyclo[3,3,1,1]decane), so that appropriately charged species may also be obtained. The complexes are straightforwardly obtained by adding the ligand to a salt solution of the metal/metals.

Suitable solvents include water and organic solvents as well as mixtures. Particularly suitable are isopropanol, ethanol, ã-butyrolactone, butanone, N-methylpyrrolidone, acetone, cyclohexanone, cyclopentanone, tetrahydrofuran, ethoxyethyl propionate, ethoxyethyl acetate, ethyl acetate or butyl acetate. The solution may also contain surfactants (ionic and/or non-ionic surfactants) or amines (e.g. triethylamine or tetramethylammonium hydroxide).

The process is advantageous, in particular, because many electronic and/or microelectronic components—before they are processed with the at least two insulating layers—are coated with a buffer coating (for example, wafers in the front-end field come in this form; the buffer coating is, for example, polyimide or polybenzoxazole; the inorganic passivation layers of silicon nitride and/or oxide, for example, are located underneath). This buffer coating may already be an insulating layer in the sense of the invention, i.e. it may be activated and subsequently coated with a further insulating layer. According to one embodiment of the process, the upper layer is patterned, whereupon the activated lower layer can be seeded and metallized in the bare regions.

BRIEF DESCRIPTION OF THE DRAWING

FIG. 1 shows a cross sectional view of the layers of a component.

DESCRIPTION OF THE PREFERRED EMBODIMENT

The invention will be explained in more detail with reference to exemplary embodiments.

EXAMPLE 1

A commercially available wafer with an already cyclized polyimide coating is wired as follows: the polyimide is activated by a short etching operation lasting 25 s in an oxygen plasma (500 W, 50 sccm oxygen, 50 mtorr). The activated wafer is immersed for 10 s in deionized water, the water is spun off and the wafer is dried for 60 s at 120?C. A second coat of a photosensitive polyimide is then spin-coated on, patterned and baked in an oven at 400?C under nitrogen. The plasma activation of the first layer creates the activated surface, to which the palladium complex can bind selectively (seeding) by immersion in a solution of 200 mg ç²,-bipyridyl-ç²,4,4?-diaminostilbenopalladium(II) in 500 ml of isopropanol. The palladium complex is then reduced (RT, 2 min) by immersion in an alkaline borohydride solution (1 g of sodium borohydride, 5 g of sodium hydroxide dissolved in 1000 ml of water). The chemical copper deposition is then carried out by immersion (10 min) in a warm commercially available copper bath.

EXAMPLE 2

The seeding is carried out as in Example 1, but in this case the selectively coupled palladium complex is reduced photochemically to form a cyclobutane derivative ($C_4(C_6H_4NH_2)_4H_4$)) and palladium(0). For this floodlighting (exposure without a mask at an exposure energy of 300 mJ/cm$^2$), a polychromatic energy source with emissions in the range of 200-500 nm is used, e.g. a high-pressure mercury lamp.

EXAMPLE 3

In the process as in Example 1, the corresponding platinum (II) complex is used instead of the palladium(II) complex. The result is similar.

EXAMPLE 4

In the process as in Example 1, the di-ì-chloro-tetraethylenedirhodium(I) complex is used instead of the palladium(II) complex. The result is similar.

EXAMPLE 5

A photosensitive polyimide is, according to the manufacturer's specifications, spin-coated onto a silicon substrate, exposed, developed and cured. To activate the polyimide, the substrate is then immersed in the following solutions:
- 10 min in an alkaline permanganate solution, consisting of 140 g/l sodium permanganate and 50 g/l sodium hydroxide, at a temperature of 40?C
- washing in deionized water
- immersion for 3 min at room temperature in semi-concentrated sulphuric acid (5 mol/l)
- washing in deionized water.

A second coat of polyimide is then spin-coated on and, as described above, patterned and cured. The bare positions on the first, activated polyimide layer are seeded by immersing the substrate for 45 min in a commercial ionogenic palladium solution at a temperature of 45?C. After washing with deionized water (immersion 3 s), the ionogenic palladium is reduced by an alkaline borohydride solution, consisting of 1 g of sodium borohydride and 5 g of sodium hydroxide per 1 l of deionized water. After washing again with deionized water and drying in a nitrogen stream, the chemical metallization is carried out by 15 min of immersion in a commercially available nickel bath.

EXAMPLE 6

Instead of the nickel bath, a commercially available copper bath is used. Otherwise as in Example 5.

EXAMPLE 7

The dielectric polybenzoxazole is applied to a silicon wafer by the spin-coating technique, pre-dried at 100?C and cured on a hotplate for 1 min each at 200?C, 260?C and 350?C under nitrogen. The surface is then activated in a water-gas plasma (CO:H$_2$ as 1:1; 500 watts, 50 sccm, 50 mtorr). The activated surface is immersed for 10 s in deionized water, the water is spun off and the wafer is dried for 60 s at 120?C A second coat of polybenzoxazole is then applied by screen printing, pre-dried and—as above—cured. The plasma activation creates a surface containing carboxyl groups, to which the palladium complex can bind selectively by immersion in a solution of 200 mg ç$^2$,-bipyridyl-ç$^2$,4,4?-diaminostilbenopalladium(II) in 500 ml of isopropanol. The palladium complex is then reduced (RT, 2 min) in an alkaline borohydride solution (1 g of sodium borohydride, 5 g of sodium hydroxide dissolved in 1000 ml of water). The chemical copper deposition is then carried out using a commercially available copper bath.

EXAMPLE 8

Similar to Example 7, but the activation is carried out by plasma with forming gas (N$_2$, H$_2$ (1:1)). Then, however, the seeding is performed with a solution of 200 mg ç$^2$,-bipyridyl-4,4?-dicarboxy-ç$^2$,-stilbenopalladium(II) in 500 ml of isopropanol, to which 0.5 ml of aqueous ammonia (24%) was added.

EXAMPLE 9

Similar to Example 7, but the activation is carried out by plasma with ammonia. Then, however, the seeding is performed with a solution of 200 mg ç$^2$,-bipyridyl-4,4?-dicarboxy-ç$^2$,-stilbenopalladium(II) in 500 ml of isopropanol, to which 0.5 ml of aqueous ammonia (24%) was added.

The figure shows a detail of a component such as a wafer, 4 layers being visible in cross section: at the bottom the substrate 1, on top of which is the insulating layer 2 which is activated. The insulating layer 3 is patterned and therefore leaves some of the surface of the activated layer 2 bare. On the bare surface, the insulating layer 2 is covered with the metallic conductive strip 4 by seeding and metallization.

The invention permits inexpensive, selective metallization of an insulating layer without stripping or etching-back. The range of application of the process is very versatile, because there is no restriction in terms of the insulator which is used. Furthermore, a wide variety of insulators can be combined. The exposure energies when photosensitive materials are used are low and the printing times when non-photosensitive materials are used are short so that a good throughput is achieved. The process is compatible with existing process lines because, when photosensitive insulators are used, the exposure for activation can be carried out in the near or far UV range (200 to 450 nm, in particular the range of from 350 to 450 nm), and illumination devices already existing in the process line can hence be used to save cost. The polymer of the insulator is not degraded and/or cleaved by the activation, so that no low-molecular waste products are created.

The invention relates to a process for the metallization of an insulator and/or a dielectric, wherein the insulator is firstly activated, it is subsequently coated with another insulator and the latter is patterned, then the first is seeded and lastly metallized.

We claim:
1. A process for metallizing at least one insulating layer of an electronic or microelectronic component, which comprises:
   applying at least one first insulating layer to a substrate such that the first insulating layer has a thickness not greater than 50 µm;
   activating the entire first insulating layer by treatment with an activator, the activator being at least one of a gas, a liquid, a solution, and a plasma;
   then, after activating the entire first insulating layer, applying to the first insulating layer a second insulating layer made of a photosensitive material, and patterning the second insulating layer made of a photosensitive material; and then, after applying and patterning the second insulating layer, seeding and metallizing regions of the first insulating layer that are exposed by the patterning step.

2. The process according to claim 1, which comprises forming the first insulating layer and the second insulating layer from the same material.

3. The process according to claim 2, which comprises patterning the first insulating layer before the entire first layer is activated and before the second insulating layer is applied.

4. The process according to claim 1, which comprises patterning the first insulating layer before the entire first layer is activated and before the second insulating layer is applied.

5. The process according to claim 1, wherein the first insulating layer is a buffer coating.

* * * * *

UNITED STATES PATENT AND TRADEMARK OFFICE
CERTIFICATE OF CORRECTION

PATENT NO. : 7,476,412 B2  Page 1 of 2
APPLICATION NO. : 09/817963
DATED : January 13, 2009
INVENTOR(S) : Klaus Lowack et al.

It is certified that error appears in the above-identified patent and that said Letters Patent is hereby corrected as shown below:

Column 4:

Line 20, "ã-butyrolactone," should read

-- ɤ- butyrolactone, --

Line 58, "120?C" should read

-- 120°C --

Line 60, "400?C" should read

-- 400°C --

Lines 63-64, "200mg ç², bipyridyl- ç², 4,4?" should read

-- 200mg ŋ² bipyridyl -ŋ² 4, 4' --

Column 5:

Line 35, "at a temperature of 40?C" should read

-- at a temperature of 40°C --

Line 44, "at a temperature of 45?C" should read

-- at a temperature of 45°C --

Line 61, "pre-dried at 100?C" should read

-- pre-dried at 100°C --

Signed and Sealed this

Eleventh Day of May, 2010

David J. Kappos
*Director of the United States Patent and Trademark Office*

Column 5:

Line 62, "cured on a hotplate for 1 min each at 200?C, 260?C and 350?C" should read -- cured on a hotplate for 1 min each at 200°C, 260°C and 350°C --

Line 66, "dried for 60 s at 120?C" should read

-- dried for 60 s at 120°C --

Column 6:

Line 4, "a solution of 200 mg ç², -bipyridyl- ç²,4,4?" should read

-- a solution of 200 mg ŋ², -bipyridyl- ŋ², 4,4' --

Lines 16-17, "a solution of 200 mg ç², -bipyridyl-4,4?- dicarboxy - ç²," should read -- a solution of 200 mg ŋ²,-bipyridyl- 4,4'- dicarboxy - ŋ², --

Lines 25-26, "a solution of 200 mg ç²,-bipyridyl -4,4?-dicarboxy- ç²," should read -- a solution of 200 mg ŋ²,-bipyridyl -4,4'-dicarboxy- ŋ², --